United States Patent [19]
Deville

[11] Patent Number: 5,511,012
[45] Date of Patent: Apr. 23, 1996

[54] APPARATUS COMPRISING A CIRCUIT HAVING AN INPUT/OUTPUT RESPONSE CONTROLLABLE BY A CONTROL SIGNAL, AND APPROXIMATION METHOD

[75] Inventor: Yannick Deville, Villecresnes, France

[73] Assignee: U.S. Philips Corporation, New York, N.Y.

[21] Appl. No.: 241,839

[22] Filed: May 12, 1994

[30] Foreign Application Priority Data

May 12, 1993 [FR] France .................................. 9305716

[51] Int. Cl.⁶ ..................................................... H03J 3/08
[52] U.S. Cl. ........................... 364/579; 333/167; 333/166; 334/1; 334/64
[58] Field of Search ........................... 364/579; 333/17.1, 333/166, 167; 455/136, 140; 334/65, 64, 1

[56] References Cited

U.S. PATENT DOCUMENTS

| | | | |
|---|---|---|---|
| 4,189,778 | 2/1980 | Vogel | 364/482 |
| 4,232,400 | 11/1980 | Yamamoto et al. | 455/305 |
| 4,375,692 | 3/1983 | Shensa et al. | 375/13 |
| 4,544,919 | 10/1985 | Gerson | 340/347 |
| 4,703,462 | 10/1987 | Woodsum | 367/92 |
| 4,768,143 | 8/1988 | Lane et al. | 364/157 |
| 4,783,818 | 11/1988 | Graupe et al. | 381/71 |
| 4,847,872 | 7/1989 | Hespelt et al. | 375/97 |
| 4,922,412 | 5/1990 | Lane et al. | 364/157 |
| 5,321,726 | 6/1994 | Kafader | 375/79 |

FOREIGN PATENT DOCUMENTS 0147518  7/1984  France .

Primary Examiner—Emanuel T. Voeltz
Assistant Examiner—Patrick J. Assouad
Attorney, Agent, or Firm—Leroy Eason

[57] ABSTRACT

The relationship between the input and output of a signal transfer circuit, such as a tune circuit, a filter, a phase shifter, an amplifier, etc., is determined by the circuit response to the input signal. The value of the circuit response (R) is controlled by the value (V) of a control signal supplied thereto. According to the invention, the relationship between the latter values is approximated by a linear regression function based on a number of measured first pairs of response/control signal values and based on such regression function a transcoder determines control signal values for providing response values of the circuit in accordance with second pairs of response/control signal values.

7 Claims, 5 Drawing Sheets

APPARATUS COMPRISING A CIRCUIT HAVING AN INPUT/OUTPUT RESPONSE CONTROLLABLE BY A CONTROL SIGNAL, AND APPROXIMATION METHOD

BACKGROUND OF THE INVENTION

The invention relates to an apparatus comprising a circuit which supplies an output signal in response to an input signal, means for changing values of said response by means of at least one control signal, calculation means for determining second pairs of response values/control signal values on the basis of an approximation of first pairs of response values/control signal values issuing from the circuit.

The invention also relates to a coding device intended for use in conjunction with such an apparatus and a method of determining said second pairs on the basis of an approximation of a series of first pairs.

Electrical or electronic circuits are known whose responses are controllable by means of devices having a property which can be varied by means of a control signal. For example, it is known to use variable capacitance diodes which have the property that their capacitance is variable by applying a variable voltage across the diode. By means of the capacitance/voltage variations it is possible to tune various electrical circuits such as oscillators or to control pass bands of filters. By means of variable conductance elements it is likewise possible to vary the gain factors of amplifiers.

Similar control mechanisms can be obtained with other elements such as gyrators, transistors or composite devices such as operational amplifiers or transconductance amplifiers.

Such units can be used in apparatuses such as television receivers, radio receivers, recording equipment and the like.

For these uses it may be desirable to have a plurality of control conditions which can be selected individually. Implementation of these control conditions should be possible with rapid procedures and with minimal hardware.

The document EP 0,147,518 discloses a tuning method for frequency selective circuits and a circuit for carrying out this method. These selective circuits, which include variable capacitance diodes, are incorporated in a tuner used, for example, in a television receiver or a radio receiver. The circuit comprises a local oscillator which serves to tune said selective circuits, generally in the factory, to the frequencies of given channels by varying the control signals applied to said diodes.

The method consists of setting the local oscillator to a frequency corresponding to a given channel, and subsequently varying the control signal voltages applied to the capacitance diodes so as to obtain an optimum alignment of the high-frequency circuit to said channel frequency. The values of the control signals applied to the capacitance diodes are then stored. These values can also be stored as deviations with respect to a corresponding voltage applied to the local oscillator, in order to reduce the capacity of the storage memory.

The alignment is controlled by an external computer. The control signals thus determined are stored in a memory in order to be read out when a selective circuit is to be tuned to a frequency of a given channel. If no value of the control signal has been stored for the desired frequency an internal computer can perform a procedure of linear interpolation between two adjacent stored values of the control signal. Each time that the channel is changed the user thus changes a control signal applied to the capacitance diode(s), which results in the desired tuning.

In order not to degrade the accuracy of the obtained tuning it is necessary to store almost as many set-point values as there are channels to be selected. Also, the linear interpolation procedure may lead to significant errors. The large number of setpoint values to be stored requires the use of a memory of such a size that the costs are no longer negligible. The size of this memory is therefore a drawback.

SUMMARY OF THE INVENTION

Therefore, it is one of the objects of the invention to provide an apparatus which requires only a memory of limited size for storing the set-point values of the circuits.

This object is achieved with an apparatus comprising:
- coding means for determining at least one linear regression function forming an approximation to a series of said first pairs of response/control signal values, and for determining codes specific to said function,
- calculation means performing, on the basis of said specific codes, a transcoding of predetermined response values into control signal values belonging to said second pairs of response/control signal values.

One use is to select a predetermined response value to be obtained, the calculation means determining the control signal which produces this response on the basis of the linear regression function.

A regression function is a function which approximates the data of a complex phenomenon in order to represent it as a simplified function.

Since said pairs are represented as a set of points in a two-dimensional space the linear regression function is represented by a straight line.

This has the advantage that by reducing the number of experimental points to a linear regression function it is possible to store a limited number of data in the memory and to calculate control signal values only for the anticipated response values. Approximated control signal values can be calculated for response values determined in experimental measurements. The request for predetermined response values can be communicated to the calculation means in coded form.

In another embodiment it can be achieved that the apparatus includes only the calculation means and receives the codes specific to the linear regression function from an external coding device.

In this case the apparatus comprises means for receiving codes specific to at least one linear regression function forming an approximation to a series of said first pairs, the calculation means performing, on the basis of said specific codes, a transcoding of predetermined response values into control signal values belonging to said second pairs.

The coding device determines at least one linear regression function forming the approximation to a series of said first pairs, and determines codes specific to said linear regression function.

The invention also relates to a method which generating a function which approximates the first pairs of response values/control signal values issuing from the circuit, and of determining second pairs of response values/control signal values on the basis of said approximation function. The method comprises:

a first phase:
  for iteratively determining at least one current linear regression function by making first errors of alternating sign and equal absolute value, which first errors are respectively measured between, first values of the dependent variable for three pairs of said series, and second values of the dependent variable determined, in accordance with said linear function, for the same values of the independent variable,
  for selecting that one of the current linear functions which produces the approximation of all the pairs of said series with minimal errors, and
  for coding the selected linear regression function with the aid of specific codes, and
a second phase for calculating, on the basis of said specific codes, control signal values belonging to said second pairs for predetermined response values.

The invention has the advantage that it can provide optimum operating conditions for the apparatus under varying conditions of use.

The invention can be employed in apparatuses comprising circuits of different types. Thus, the circuit may be a remnant circuit, a filter, an oscillator, a phase shifter, an amplifier and the like.

In more general terms, the apparatus may be an apparatus which includes a tuner, particularly a camcorder, a television receiver, a radio receiver, a video recorder and the like.

These and other aspects of the invention will become apparent from and will be explained on the basis of embodiments described hereinafter.

BRIEF DESCRIPTION OF THE DRAWINGS

The invention will be more fully understood with the aid of the following Figures, given by way of non-limitative examples, in which.

DETAILED DESCRIPTION OF THE PREFERRED EMBODIMENT

Reference is now made, by way of example, to the case of a resonant circuit to be tuned successively to a plurality of tuning frequencies.

Figure 1:
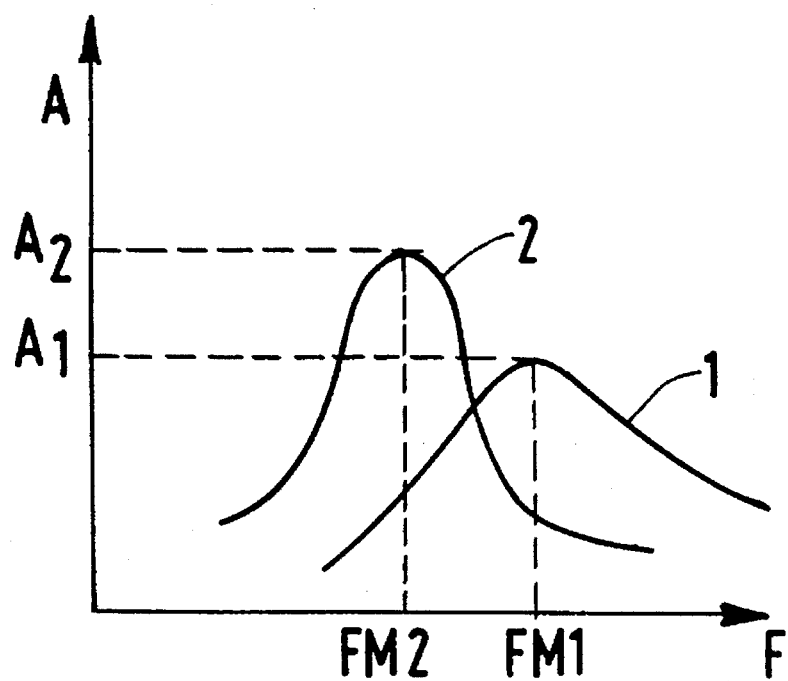
FIG. 1 shows two curves relating the output voltage modulus to the frequency of an input signal of constant amplitude for two tuned circuits.

FIG. 1 shows a curve 1 representing the amplitude A of an output signal OUT of the resonant circuit as a function of the frequency F of an input signal IN of constant amplitude applied to the input. The curve 1 has a maximum at the frequency $F_{M1}$ for an output signal $A_1$. In the present case this resonant circuit has a variable capacitance diode whose capacitance varies with a voltage V applied across the variable capacitance diode. The tuning frequency of the resonant circuit changes when V is varied. The curve 2 represents this second situation with a tuning frequency $F_{M2}$ corresponding to an output signal $A_2$.

Figure 2:
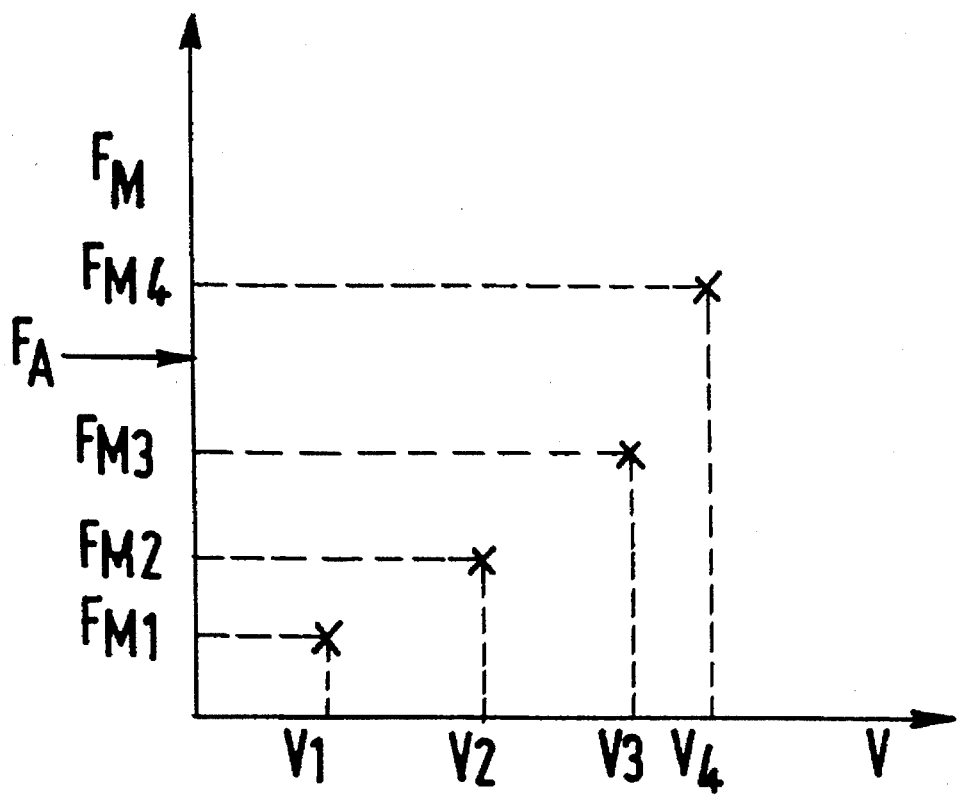
FIG. 2 shows measurement points of tuning frequencies as function of a control signal V for a tuned circuit.

Thus, the tuning frequency of the resonant circuit varies with the voltage V. FIG. 2 shows an example of measurement points of several tuning frequencies $F_M$ for different values V. The measurement points form a discrete series of points measured on the present resonant circuit. If it is required to tune the resonant circuit to a given frequency, for example $F_A$ in FIG. 2, the afore-mentioned experimental measurements would have to be resumed if the invention were not applied.

Figure 5:
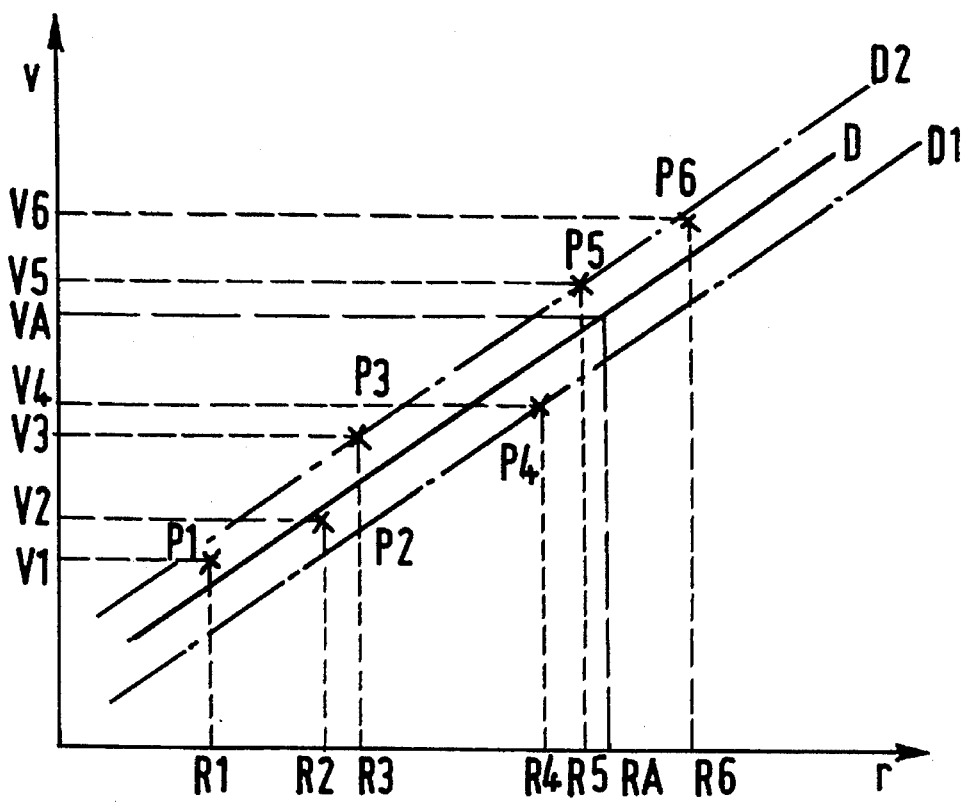
FIG. 5 shows a graph representing measurement points with a regression line D.

It is to be noted that the vertical axis relates to a dependent variable corresponding to tuning frequencies and that the horizontal axis relates to an independent variable corresponding control signal values. In FIG. 5 the control signal values become dependent variables and the response values become independent variables. Consequently, the points are arranged in an increasing order of the values of the independent variable, which defines an index i which increases with said values. An inverse convention can be adopted by accordingly modifying the following enunciation.

The invention aims at deriving the control voltage to be applied across the variable capacitance diode by means of which the resonant circuit can be tuned to the tuning frequency $F_A$ on the basis of an approximation corresponding to measurement points already available, without resort to new experiments.

Furthermore, the tuning frequency $F_A$ may be equal to a tuning frequency which has given rise to a measurement of a pair of experimental values.

This mode of operation is particularly advantageous on assembly lines for tuned circuits, which by means of a small number of measurement points make it possible to derive all the control signals necessary for tuning the resonant circuit to all the reception frequencies. The same procedure applies, for example, when an apparatus is serviced to allow for aging of the electronic components of the resonant circuit. In that case it suffices to carry out a few experimental measurements, from which all the other values can be derived by means of the invention.

The invention derives an approximation in the form of at least one regression line from the discrete series of measurement points relating the coordinates of the pairs of response values/control signal values.

Figure 3:
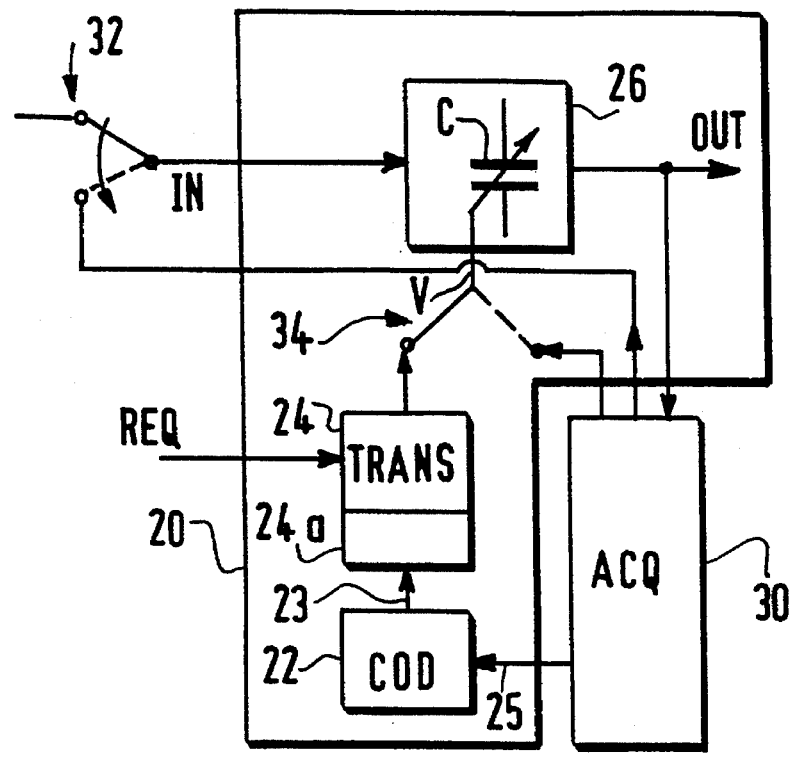
FIG. 3 is a diagram of an apparatus in accordance with the invention with an integrated coding device.

FIG. 3 shows an apparatus 20 which, in accordance with the invention, comprises coding means COD 22, which determine the regression line and which encode this line, and calculation means TRANS 24, which receive the codes (line 23) and, in response to a request signal REQ, effect a transcoding to supply a control signal V to a circuit 26.

For its operation the coder 22 should receive measurement points acquired by means of an external measurement unit ACQ 30. The unit 30 is connected to the input of the circuit 26 by a selector 32 during this acquisition of measurement points. The apparatus 30 supplies a signal of known amplitude and known frequency to the input of the circuit 26. The output signal OUT is measured by the unit 30. By means of a selector 34 the unit 30 can apply a control signal V to the circuit 26, for example a variable capacitance diode C. By varying the frequency of the input signal and the value of the control voltage it is then possible to obtain a plurality of measurement points relating the control signal to the relevant response of the circuit, for example its tuning frequencies. These measurement points are transferred to the coder 22 for further processing.

Figure 4:
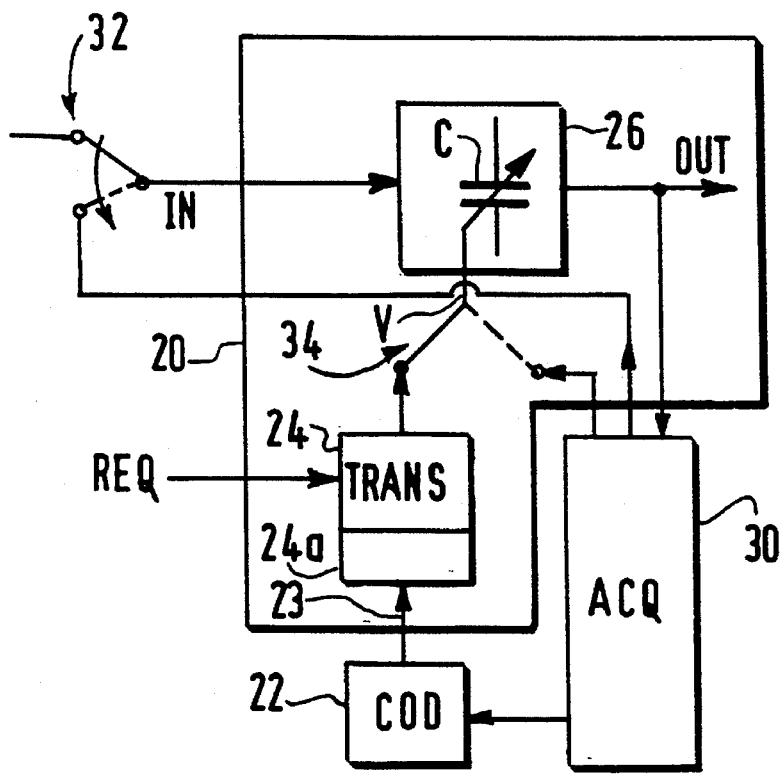
FIG. 4 is a diagram of an apparatus in accordance with the invention with an external coding device.

Alternatively, the coder 22 may not form an integral part of the apparatus. In fact, it may be an external coding device 22 which is, for example, situated at the factory or a maintenance service for adjustment of the apparatus. FIG. 4 is similar to FIG. 3 but shows the coding device 22 external to the apparatus 20.

Once the measurement points have been acquired the coder 22 should determine the optimum regression line(s). For this, reference is made to FIG. 5, which by way of example shows six measurement points $P_1$ to $P_6$ in a two-dimensional representation.

Each of these points is defined by a pair of values (v, r) relating a value v of the control signal to a response value r, for example a maximal tuning frequency.

The points are arranged in accordance with an increasing order of the abscissa values $R_i$, which defines an index i which increases with said values. An inverse convention can be adopted by accordingly modifying the following enunciation.

In accordance with the invention the set of pairs ($R_1$, $V_1$), ($R_2$, $V_2$) ... is approximated by a regression line D having the equation:

$$D: v = p \cdot r + q. \quad (1)$$

where v and r are running variables.

The principle is to select three pairs of values, for example ($R_3$, $V_3$), ($R_4$, $V_4$), ($R_5$, $V_5$), and to determine a regression line D by balancing of absolute errors. An error is measured by measuring the difference occurring, for a given abscissa r, between the measured value v of the point and the ordinate v measured on the regression line. Balancing of the errors at three points consists in having three errors equal in absolute value with the error sign of the intermediate point being opposite to the two others points, the intermediate having an abscissa r situated between the abscissae r of the two other points. Subsequently, it is examined if for the entire remaining points of the set the error which separates each of them from the line remains smaller or equal in absolute value than/to the error previously determined for the three selected points. This is due to the fact that one is interested in a worst-case error relating to the set of all the points to be considered, i.e. the largest error in absolute value occurring between one of the points and the regression line. If all the other errors are actually smaller or equal, the line is selected to represent the set of all points. If this is not the case, the operations are repeated with three different points having new pairs of values in order determine another regression line.

There may be a plurality of regression lines representing all the points of the set. In accordance with the method, an optimum regression line is determined which minimizes the worst-case error defined above.

FIG. 5 shows an example comprising six points $P_1$ to $P_6$ in a two-dimensional representation. Now the final result will be considered for explanatory purposes. It will be noted that the regression line D is situated in such a manner that the errors are equal in absolute value for the points $P_3$, $P_4$ and $P_5$. For the points $P_1$, $P_2$, $P_6$ the errors are smaller in absolute value than the preceding ones. In a set of points $P_1$ to $P_6$ the method will thus consist in finding the three particular points, in the present case $P_3$, $P_4$, $P_5$, which enable the optimum regression line to be determined which minimises the worst-case error, and in subsequently coding based on this line. In the case that FIG. 5 represents the final if result, if two straight lines $D_1$ and $D_2$ are drawn parallel to the regression line D and passing through the points $P_3$, $P_4$, $P_5$ defining the regression line D, all the points of the set will be situated within a band bounded by the lines $D_1$ and $D_2$ or are situated on these lines.

The method of determining the regression line may have several variants, of which only the most advantageous ones will be described hereinafter.

To choose the triplet of points, a pair of points is determined to which another point is added. On the other hand, the determination of the regression line assumes that an identical accuracy is desirable throughout the measurement range for the actual tuning frequency of the circuit. However, tuning frequencies situated in different ranges do not require an identical accuracy as far as the control signal generated by the transcoding means is concerned. For this purpose, in accordance with the invention, it is preferred to assign weighting coefficients W to the approximations performed as a function of the measurement points. These coefficients are proportional to the absolute values of the derivative of the curve of the actual tuning frequency as a function of the control signal.

The weighting coefficients may be common to a plurality of points or they may be individual for each point. Hereinafter, these weighting coefficients $W_i$ are considered to be strictly positive.

In the case in which there are weighting coefficients an error $E_{PD}$ between a point $P_i$ and the regression line D is defined in such a manner that:

$$E_{PD}(P_i, D) = W_i \cdot [V_i - (p \cdot R_i + q)] \quad (2)$$

where $E_{PD}$ is a value having a sign. The determination of the regression line D for three points $P_i$, $P_j$, $P_k$, where i<j<k, then requires the calculation of the variables p and q in such a manner that:

$$p = \text{NUMP/DET and } q = \text{NUMQ/DET}$$

where the quantities NUMP, NUMQ and DET are defined by:

$$DET = W_i \cdot W_j \cdot (R_j - R_i) + W_j \cdot W_k \cdot (R_k - R_j) + W_i \cdot W_k (R_k - R_i)$$

$$NUMP = W_i \cdot W_j \cdot (V_j - V_i) + W_j \cdot W_k \cdot (V_k - V_j) + W_i \cdot W_k \cdot (V_k - V_i)$$

$$NUMQ = W_i \cdot W_j \cdot (R_j \cdot V_i - R_i \cdot V_j) + W_j \cdot W_k (R_k \cdot V_j - R_j \cdot V_k) + W_i \cdot W_k \cdot (R_k \cdot V_i - R_i \cdot V_k)$$

Moreover, the error $E_T$ associated with this triplet can be expressed and calculated by:

$$E_T(P_i, P_j, P_k) = |E_{PD}(P_i, D)|$$

where $$E_{PD}(P_i, D) = -E_{PD}(P_j, D) - E_{PD}(P_k, D)$$

or $$E_T = \quad (3)$$

-continued
$$\frac{W_i.W_j.W_k.|(R_i.V_j - R_j.V_i) + (R_j.V_k - R_k.V_j) + (R_k.V_i - R_i.V_k)|}{DET}$$

First of all, a pair of points is selected, to which an additional point, situated between these two points, is added to form a triplet of points. For this purpose (FIG. 7) a selection (102a) is performed to choose a pair of points $P_i$, $P_k$ belonging to this set, in such a manner that there is at least one intermediate point $P_1$ having a response value $R_1$ situated between the response values $R_i$ and $R_k$ of the pair to form at least one triplet of points.

For the points $P_i$, $P_1$, $P_k$ forming the triplet, a factor $F_1$ is then defined which links the respective coordinates and the respective weighting coefficients of the points $P_i$, $P_1$, $P_k$. The factor $F_1$ is assigned to the central point 1, in such a way that:

$$F_l = \frac{W_l}{R_k - R_i} \cdot \left[ \frac{R_l - R_i}{W_k} + \frac{R_k - R_l}{W_i} \right]$$

This factor $F_1$ influences the determination of the intermediate point $P_1$ which is to be selected (i<1<k) to form the triplet, taking into account the weights assigned to the points. It is first attempted to form a regression line situated below $P_i$ and $P_k$. For each intermediate point $P_1$ the regression line $D_1$ associated with the triplet $P_i$, $P_1$, $P_k$ and the error $E_{T1}$ associated with the triplet are calculated. For each intermediate point $P_1$ it is ascertained if $F_1=1$ and $E_{PD}(P_i, D_1)<0$. If at least one point satisfies this requirement there is no regression line situated below $P_i$ and $P_k$ and otherwise a quantity $G_{max}$ is determined which is the maximum value among:

on the one hand, the quantities $E_{PD}(P_i, D_1)$ for all the intermediate points, on the other hand, the following quantities (a), only for the intermediate quantities for which $F_1<1$, $$\frac{F_l+1}{F_l-1} \cdot E_{PD}(P_i,D_l). \tag{a}$$

with

If there is at least one intermediate point such that $F_1>1$ a further quantity $G_{min}$ is defined, which is the minimum value assumed by (a) only for the intermediate points for which $F_1>1$. It is now checked if there is at least one intermediate point for which:

$E_{PD}(P_i, D_1) \geq 0$ $G_{max} \leq \alpha E_{T1}$ and $G_{min}$. $\alpha \geq E_{T1}$ ($\alpha$, coefficient$\geq 1$). If there is such a point it is chosen as the intermediate point in order to form the triplet.

If there is no intermediate point for which $F_1>1$, it is checked if there is at least one intermediate point such that:

$E_{PD}(P_i, D_1)>0$ $G_{max} \leq \alpha.E_{T1}$ ($\alpha$: coefficient$\geq 1$).

If there is such a point it is chosen as the intermediate point in order to form the triplet.

If no triplet has been formed it is attempted to form a regression line situated above the points $P_i$ and $P_k$. The same method is applied with the sign of the errors $E_{PD}$ inverted.

If no point $P_1$ has been selected the process is restarted with another pair $P_i$, $P_k$.

When the error $E_T$ has thus been calculated for the triplet $P_i$, $P_1$, $P_k$ it is ascertained whether the other points of the set produce errors which, in absolute value, are smaller than or equal to those of the points $P_i$, $P_1$, $P_k$. For this purpose an additional point $P_m$ (block 106a) whose abscissa r is outside the abscissae $R_i$, $R_k$ is selected and the absolute value is calculated for the error $E_{Pm}$ (block 108) between the value of the variable v at the point $P_m$ and the line D.

When this error $E_{Pm}$ has an absolute value smaller than or equal to $E_T$ (block 110) (reference Y) the additional point $P_m$ is accepted and the method proceeds (block 112) with a following additional point (block 106a). If all the additional points meet the criterion $|E_{Pm}| \leq E_T$ the line D is accepted and its coefficients are used to code the regression line D (block 114).

When this error $E_{Pm}$ is larger than $E_T$ (block 110) (reference N) the selected triplet of points $P_i$, $P_1$, $P_k$ is not accepted and another triplet of points (block 116) is chosen from the set of points (blocks 102, 102b). The method ends when a line D (block 114) is obtained which meets this criterion even if all the triplets of points have not been examined.

Situations may occur in which at the end of step 116 all the possible points have been examined and none of the triplets has provided a solution (block 118). In that case it is possible to resume the program by incrementing $\alpha$ and/or by replacing the test in block 110 by the following test:

$|E_{Pm}| \leq \beta.E_T$ where $\beta$ is a coefficient slightly greater than 1.

Other methods of determining the regression line(s) are conceivable to those skilled in the art.

It is for example possible to choose an arbitrary triplet of points, to determine the regression line as indicated above, and to check if the resulting errors for the other points are smaller than for the selected triplet. If this is not the case the procedure is repeated with another triplet.

It is also possible to determine the regression lines corresponding to all the triplets that can be formed from the series of points and to select the regression line providing the largest triplet error.

It is likewise possible to determine an upper envelope and/or a lower envelope passing through the extreme points of the set of measurement points plotted in a two-dimensional diagram, and to select pairs of adjacent points belonging to either envelope. The third point, for the formation of a triplet, is then a point having an abscissa between the abscissae of the points of the selected pair.

The apparatus in accordance with the invention may use other methods which determine other piece-wise linear functions by approximation to pairs of values measured in the circuit and which guarantee a small approximation error.

When the set of points to be processed is too large to be represented by a single regression line it is possible to represent this set by a plurality of regression lines which each have a given range of validity. These regression lines can be defined by the method described above or by other methods.

The lines are determined from a discrete and limited series of measurement points. However, for the use of the regression lines it is necessary to define their domain, which extends over a continuum of values situated between two abscissa limits. The determination of the lines yields a sequence of straight lines whose ends are not necessarily connected to one another.

For certain uses it may be useful to ensure that two successive regression lines are joined to one another in order to avoid abrupt variations of one of the variables. When the regression lines have been determined one possibility is to replace one end of a first regression line by the nearest end of an adjacent second regression line and to recalculate the codes of the first regression line, which becomes a modified first regression line. Any other method is suitable. Joining the different regression line segments to one another is particularly useful, for example, to set a tuner to different reception channels.

Figure 8:
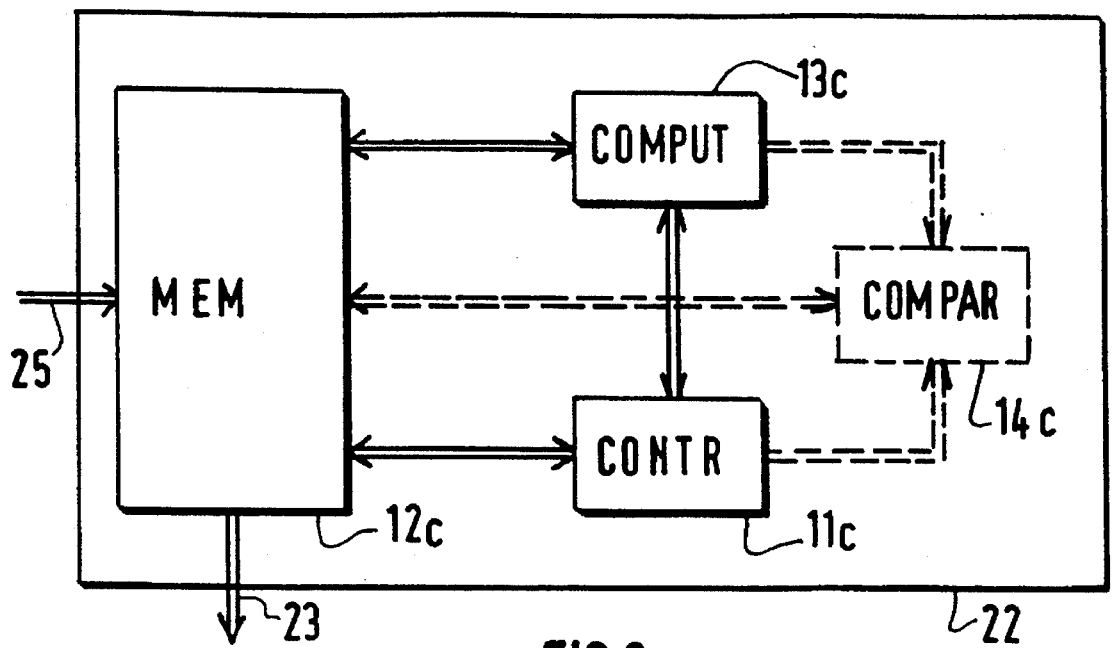
FIG. 8 is a diagram of a device for coding a regression line.

The different methods which have just been described to determine the linear regression function can be used in a coding device 10 (FIG. 8), which comprises:

- a memory 12c MEM, which stores in particular all the values belonging to the set of points to be processed. These points are represented by their coordinates (R, V) and, if applicable, their weights W or their inverse weights 1/W,
- a computing unit 13c COMPUT, which determines the intermediate points and forms the triplets, for example on the basis of pairs of points $P_i$, $P_k$ and which, for each selected triplet, computes the regression line adapted to each triplet, i.e. the codes p, q of the line and the error $E_T$ associated with the triplet.

Moreover, a controller 11c CONTR enables the operations to be controlled and new triplets to be addressed by read-out/read-in of the memory 12c and loading the computing unit 13c with new triplets. Selection of the regression line to be retained is possible by selecting the regression line providing the largest triplet error. This selection is effected by the calculation unit 13c.

Figure 7:
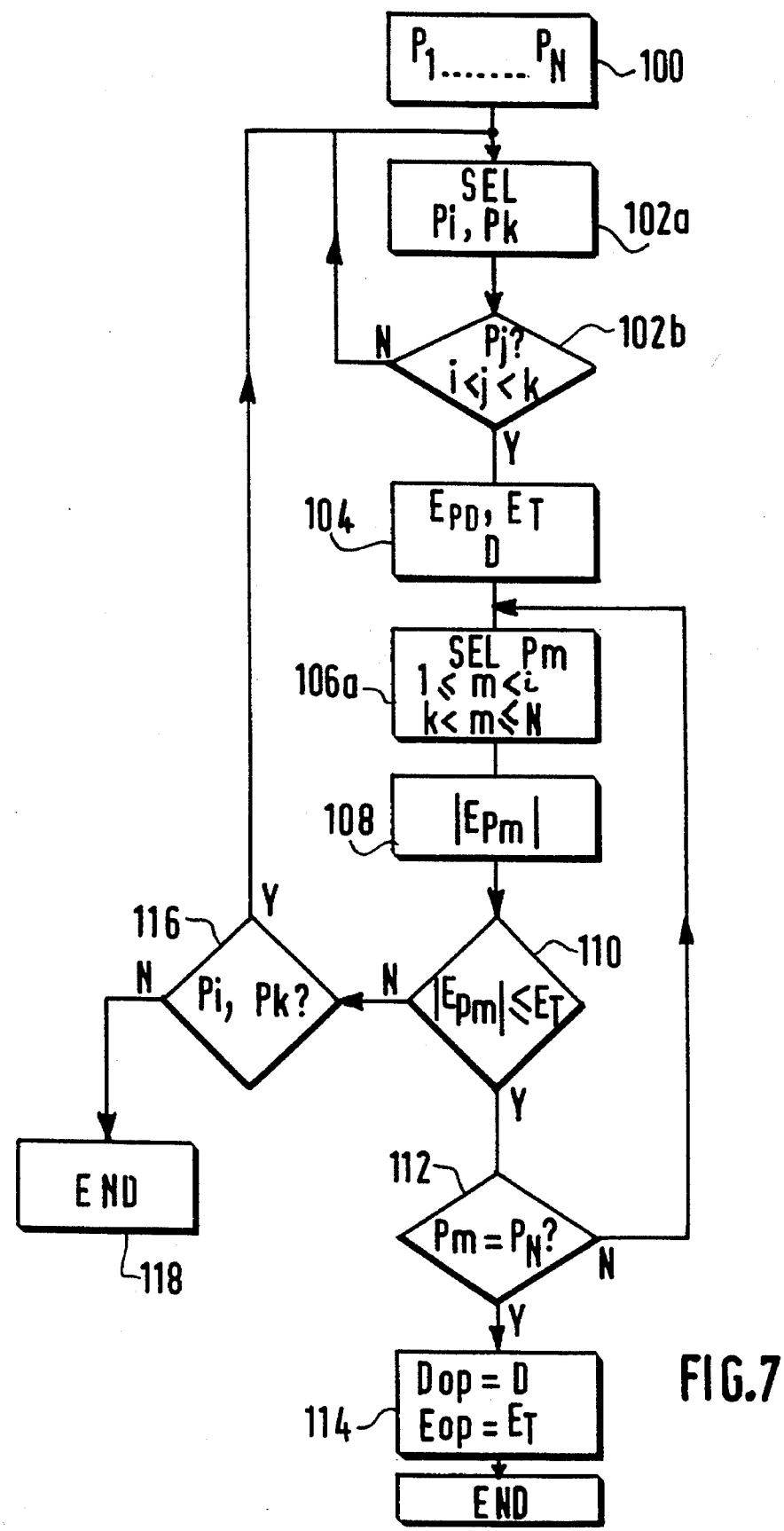
FIG. 7 is a flow chart of the determination of a regression line on the basis of pairs of measurement points.

Likewise, in accordance with a preferred method described with reference to FIG. 7, it is possible for each current regression line to check if the other additional points of the series yield an error smaller than the triplet error. For this purpose the coding device 22 comprises a comparison unit 14c.

The calculation unit 13c transfers the codes p, q of the regression line of the current triplet to the comparison unit 14c COMPAR, which determines if the additional points of the set of points generate a smaller error with this regression line than that generated by the points of the current triplet. For this purpose, the comparison unit 14c performs the following test:

$$|E_{P_m}| > E_T$$

If the current regression line is not accepted (positive test) another triplet is selected and a similar process is repeated. If the test is negative for all the additional points the regression line is accepted and the calculation unit 13c loads its parameters into the memory 12c. The memory 12c thus receives either the codes p, q or the coordinates (x, y) of the ends of the regression lines forming the approximation to the experimental pairs.

The calculation unit 13c may also be programmed to determine the envelopes. Subsequently, the comparison unit 14c compares the errors relating to the various triplets resulting from the envelopes.

To control the operations and to address new triplets (when the triplets thus examined are not satisfactory) the controller 11c controls:

- the read-out/read-in of the memory 12c,
- the loading of the calculation unit 13c with a pair of points for which the intermediate point $P_1$ is determined in order to form new triplets,
- the transfer to the comparison unit 14c of all the additional points to be examined successively.

Figure 9:
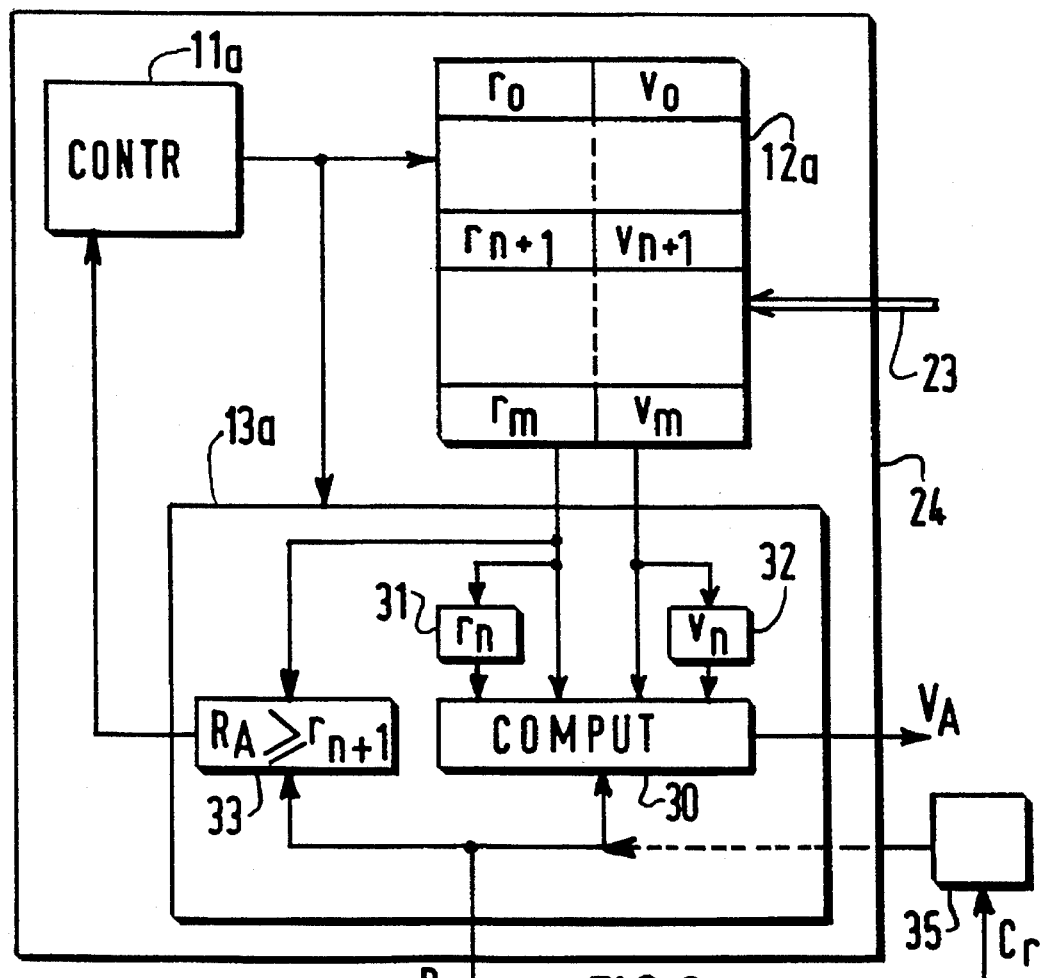
FIG. 9 is a diagram of a calculation device for transcoding response values into control signal values derived from a plurality of regression lines.

After they have been determined the codes are transferred to the transcoder 24 (FIG. 9) where they are loaded into a memory 12a, which is addressed by a controller 11a to form the codes of the addressed regression lines formed, for example, by values of the variables r, v at the ends of the regression line segments. The memory 12a, which is for example organised in rows, contains for each regression line the values r and v defining the size of each regression line.

It is also possible to store the codes p and q of the calculated regression lines as well as the dimensions of their range of application.

The transcoder 24 comprises:

- the controller $11_a$,
- the memory 12a, and
- a processing unit $13_a$. This unit receives a requested value of the variable $R_A$ for which a result $V_A$ is to be obtained in accordance with the approximation function characterising the set of points. For this purpose, the controller $11_a$ successively supplies rows of codes from the memory $12_a$. The processing unit checks which line corresponds to said value $R_A$ by comparing it with the coordinates of the ends of the lines. This check is effected in a comparator 33. Subsequently, the processing unit 13a calculates for example the slope $P_n$ of the selected line from the coordinates of the end of this line, for example that of the order n.

For this purpose the values $r_{n+1}$ and $v_{n+1}$ are applied to the input of a calculation unit 30, which also receives values $r_n$ and $v_n$ previously loaded into the registers 31 and 32, respectively.

Subsequently, the unit 30 determines the value $$V_A = p_n(R_A - r_n) + v_n$$

The data $R_A$ can be presented to the transcoder either in non-coded or in coded form. For example, when it is desired to tune the resonant circuit to a given frequency $F_A$ the device may be adapted to receive a frequency expressed in Hertz. However, it is also possible that the frequency (frequencies) $F_A$ have been precoded so as to be accessible by means of code words $C_r$. In that ease a decoder 35 converts the code word $C_r$ into the value $R_A$. Preferably, the transcoding device 24 is adapted to directly receive the code words $C_r$, the parameters ($C_r$, v) stored in the memory 12a being determined accordingly.

The invention has been described for the preferred case in which the variable is a tuning frequency of a resonant circuit. The invention aim applies to the case that a cut-off frequency of a filter is to be controlled by means of an external control signal. Likewise, it may apply to an amplifier whose gain is to be defined. This may involve the definition of a frequency for which the amplifier produces a predetermined gain. Thus, it is possible to determine the approximation function on the basis of measurement points relating a limit frequency to a control voltage for a constant gain.

The method then consists in determining the control voltage which ensures said constant gain for a selected frequency. The response in question then remains linked to the relationship gain/control voltage but the request REQ is presented to the transcoder in the form of a given frequency, for which the gain has to have the previous constant value. The decoder 35 provides the dam conversion.

Figure 6A:
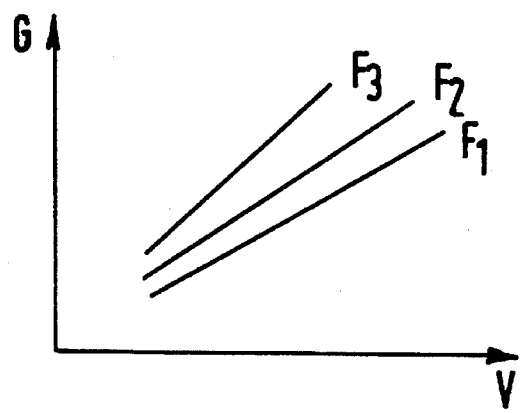
FIG. 6A and 6B show two graphs representing lines relating the variations of the gain (at constant frequency) and the variations of the frequency (at constant gain) as function of a control signal in the case of an amplifier.
Figure 6B:
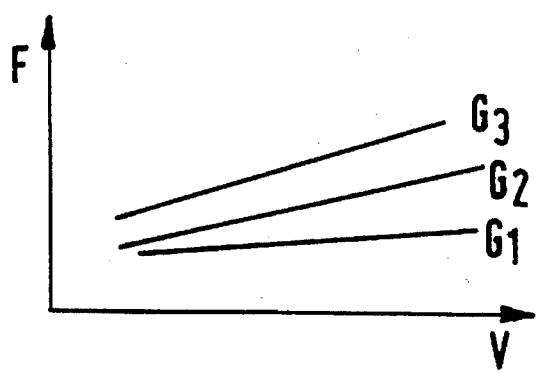

The experimental measurement values can be acquired either by measuring the gain G as function of the control voltage at different constant frequencies $F_1$, $F_2$, $F_3$ (FIG. 6-A) or by measuring the frequency F as function of the control voltage for a constant gain $G_1$, $G_2$, $G_3$ (FIG. 6-B). Preferably, the invention uses this second possibility although the response in question is to impose a gain.

Likewise, it may concern a given phase shift to be obtained in a phase shifter. Here, the request is also expressed in terms of a selected frequency at which the phase shift should have a predetermined value.

Thus, to determine the control voltage which provides a 90° phase shift at a given frequency, it is first of all required to acquire measurement points which relate the frequency to the control voltage for a predetermined value of the phase shift. In this way a regression line is derived. Thus, it is possible to carry out a request REQ, expressed in terms of frequency, which will determine the value of the control voltage for obtaining the predetermined phase shift at the frequency defined by the request REQ.

I claim:

1. An apparatus comprising: a signal transfer circuit which produces an output signal in response to an input signal thereto, the output signal being related to the input signal in accordance with a response value (R) of said circuit; means for supplying a control signal to said circuit which changes the response value (R) thereof in accordance with changes in the value (V) of said control signal; and calculation means for deriving second pairs (RA,VA) of response/control signal values on the basis of an approximation of the relationship between measured first pairs $(R_1,V_1)$, $(R_6,V_6)$ of response/control signal values; characterized in that:

said apparatus further comprises coding means for deriving said approximation in the form of at least one linear regression function based on the measured first pairs of response/control signal values;

said calculation means includes transcoding means which uses said linear regression function to transcode requested response values (REQ) into control signal values belonging to said second pairs of response/control signal values.

2. An apparatus comprising: a signal transfer circuit which produces an output signal in response to an input signal thereto, the output signal being related to the input signal in accordance with a response value (R) of said circuit; means for supplying a control signal to said circuit which changes the response value (R) thereof in accordance with changes in the value (V) of said control signal; and calculation means for deriving second pairs (RA,VA) of response/control signal values on the basis of an approximation of the relationship between measured first pairs $(R_1, V_1)$, $(R_6, V_6)$ of response/control signal values; characterized in that:

said apparatus further comprises means for receiving externally supplied codes which define at least one linear regression function based on measured first pairs of response/control signal values, and supplying said codes to said calculation means; and said calculation means derives from said codes control signal values corresponding to requested response values (REQ), said response values and control signal values belonging to said second pairs of response/control signal values.

3. An apparatus as claimed in 1, wherein said circuit is any of the class consisting of a tuned circuit, a filter, an oscillator, a phase shifter, and an amplifier.

4. An apparatus as claimed in 1, included as part of a larger apparatus which is any of the class consisting of a tuner, a television receiver, a radio receiver, a video recorder and a camcorder.

5. A coding device for use with apparatus which comprises: a signal transfer circuit which produces an output signal in response to an input signal thereto, the output signal being related to the input signal in accordance with a response value (R) of said circuit; means for supplying a control signal to said circuit which changes the response value thereof in accordance with changes in the value (V) of said control signal; and calculation means for deriving second pairs (RA,VA) of response/control signal values on the basis of an approximation of the relationship between measured first pairs $(R_1, V_1)$, $(R_6, V_6)$ of response/control signal values;

said coding device being characterized in that it comprises:

means for receiving the measured first pairs of response/control signal values from said apparatus, and based thereon deriving said approximate relationship in the form of at least one linear regression function, and means for deriving from said regression function code combinations of control signal values and response values belonging to said second pairs of response/control signal values, and supplying said code combinations to said calculation means.

6. A method for use in apparatus which includes a signal transfer circuit which produces an output signal in response to an input signal thereto, the output signal being related to the input signal in accordance with a response value (R) of said circuit; said circuit being controlled by a control signal which changes the response value (R) thereof in accordance with changes in the value (V) of said control signal; said method generating at least one linear regression function which approximates first pairs $(R_1, V_1)$, $(R_6, V_6)$ of response/control signal values, and based on said regression function determining second pairs (RA,VA) of response/control signal values; said method being characterized in that it comprises:

(i) determining a first linear regression function based on three pairs in a first series of measured pairs of response/control signal values $(R_3/V_3, R_4/V_4, R_5/V_5)$, said three pairs having errors of equal magnitude and alternating sign with respect to said first linear regression function;

(ii) iteratively repeating step (i) for at least three other pairs in said first series of measured pairs of response/control signal values, to derive at least a second linear regression function;

(iii) selecting that one of the derived linear regression functions which approximates all of the pairs in said first series of measured pairs of response/control signal values with minimal error; and (iv) using the selected derived linear regression function to provide control signal values for specified response values belonging to said second pairs of response/control signal values.

7. A method is claimed in claim 6, wherein a respective weighting coefficient is associated with each pair of response/control signal values, which coefficient is used to weight the error relating to said pair during said selection of one of the derived linear regression functions.

* * * * *